United States Patent
Kang

Patent Number: 6,080,622
Date of Patent: Jun. 27, 2000

[54] METHOD FOR FABRICATING A DRAM CELL CAPACITOR INCLUDING FORMING A CONDUCTIVE STORAGE NODE BY DEPOSITING AND ETCHING AN INSULATIVE LAYER, FILLING WITH CONDUCTIVE MATERIAL, AND REMOVING THE INSULATIVE LAYER

[75] Inventor: Woo-Tag Kang, Kyunggi-do, Rep. of Korea

[73] Assignee: Samsung Electronics Co., Ltd., Rep. of Korea

[21] Appl. No.: 09/281,575

[22] Filed: Mar. 30, 1999

[30] Foreign Application Priority Data

Mar. 30, 1998 [KR] Rep. of Korea ............ 98-10987

[51] Int. Cl.⁷ ............................................. H01L 21/8242
[52] U.S. Cl. ..................... 438/253; 438/396; 257/306
[58] Field of Search ................................. 438/253, 254, 438/396; 257/306

[56] References Cited

U.S. PATENT DOCUMENTS

| | | | |
|---|---|---|---|
| 5,032,233 | 7/1991 | Yu et al. | 204/192.28 |
| 5,146,291 | 9/1992 | Watabe et al. | 357/23.4 |
| 5,217,913 | 6/1993 | Watabe et al. | 437/44 |
| 5,331,116 | 7/1994 | Haslam et al. | 174/250 |
| 5,449,644 | 9/1995 | Hong et al. | 437/225 |
| 5,490,901 | 2/1996 | Kim | 156/643.1 |
| 5,498,889 | 3/1996 | Hayden | 257/301 |
| 5,529,946 | 6/1996 | Hong | 437/52 |
| 5,534,463 | 7/1996 | Lee et al. | 437/195 |
| 5,543,357 | 8/1996 | Yamada et al. | 437/192 |
| 5,593,920 | 1/1997 | Haslam et al. | 437/195 |
| 5,698,902 | 12/1997 | Uehara et al. | 257/773 |
| 5,710,073 | 1/1998 | Jeng et al. | 438/239 |
| 5,834,847 | 11/1998 | Jung et al. | 257/773 |
| 5,877,062 | 3/1999 | Horii | 438/396 |
| 5,879,982 | 3/1999 | Park et al. | 438/241 |
| 5,989,954 | 11/1999 | Lee et al. | 438/253 |
| 5,994,181 | 11/1999 | Hsieh et al. | 438/239 |

OTHER PUBLICATIONS

U.S. application No. 09/224,741, Lee et al., filed Dec. 31, 1998.

*Primary Examiner*—Wael Fahmy
*Assistant Examiner*—William M. Brewster
*Attorney, Agent, or Firm*—Myers Bigel Sibley & Sajovec

[57] ABSTRACT

Disclosed is an improved method for fabricating a DRAM cell capacitor. The method includes the steps of depositing a first insulating layer over a semiconductor substrate having a field effect transistor, etching the first insulating layer and forming a contact hole therein to one of two source/drain areas of the field effect transistor, filling the contact hole with a first conductive layer thereby to form a contact plug, depositing a thin second conductive layer and a relatively thick second insulating layer on the contact plug and the semiconductor substrate, etching the second insulating layer using a capacitor mask and forming an opening in the second insulating layer to the second conductive layer at a position opposite to underlying the contact plug, filling the opening with a third conductive layer thereby to form a storage node pattern, removing the second insulating layer outside of the storage node pattern, etching the second conductive layer until the first insulating layer outside of the storage node pattern is exposed thereby to form a storage node.

11 Claims, 2 Drawing Sheets

METHOD FOR FABRICATING A DRAM CELL CAPACITOR INCLUDING FORMING A CONDUCTIVE STORAGE NODE BY DEPOSITING AND ETCHING AN INSULATIVE LAYER, FILLING WITH CONDUCTIVE MATERIAL, AND REMOVING THE INSULATIVE LAYER

FIELD OF THE INVENTION

The present invention relates to a method for fabricating a semiconductor device and more particularly to a method for fabricating a DRAM cell capacitor.

BACKGROUND OF THE INVENTION

As DRAMs(dynamic random access memory) increase in memory cell density to the 1 Giga level, there is a continuous challenge to maintain sufficiently high storage capacitance despite decreasing cell area. Additionally there is a continuing goal to further decrease cell area. Contact holes of a high integration density device such as DRAMs become inevitably a high aspect ratio, that is, a smaller area comparing with the depth. On the other hand, the capacitance of the capacitor must have more than a constant value despite decreasing cell area. In order to keep a capacitance of such capacitor at an acceptable value, a stacked capacitor or a trench stacked capacitor has been used since it can provide a large capacitor area therein. The stacked capacitor has received much interest in recent years because of the variety of ways that the capacitor can be extended upward over the cell area, increasing its capacitance without requiring additional area on the substrate.

The reduced contact hole size and increased capacitor height bring about undesirably another problems. The conventional method for fabricating a DRAM cell capacitor is depicted in FIG. 1 which illustrates the cross-sectional view of a portion of a semiconductor substrate.

Referring to FIG. 1, a field oxide layer 12 has been formed over the semiconductor substrate 10 so as to define a device area. A gate electrode structure 14 has been formed the device area of the semiconductor substrate 10 disposing a gate oxide layer(not shown) therebetween. Source/drain regions 16 has been formed in and on the device area adjacent to the gate electrode structure 14. An insulating layer 18 has been formed on the gate electrode structure 14 and over the semiconductor substrate 10. An electrically conductive contact plug 20 has been formed in the insulating layer 18 to one of two the source/drain regions 16. A storage node 24 of a capacitor has been formed on the contact plug 20.

The process step for forming the storage node 24 is as follows. After forming the contact plug 20, a polysilicon layer is formed on the contact plug 20 and over the insulating layer 18 to have a thickness of about 10000 Å. A photoresist layer is deposited over the polysilicon layer and then patterned. The polysilicon layer is then etched back using the patterned photoresist layer as a mask, thereby to form the storage node 24. During the step of etching back about 10000 Å thick polysilicon layer, the polysilicon layer at the bottom edge portion of the storage node 24, i.e., the polysilicon layer at the interface between the storage node 24 and the insulating layer 18 is over-etched.

If the storage node 24 is misaligned to the underlaying contact plug 20, the over-etching phenomenon of the polysilicon layer becomes severe as shown in FIG. 1. Accordingly, the storage node falls down in subsequent cleaning process making undesired electrical short between the storage nodes.

SUMMARY OF THE INVENTION

The present invention was made in view of the above problem, and it is therefore an object of the invention to provide a method for fabricating a DRAM cell capacitor with a good characteristics by preventing the over-etching phenomenon of the storage node.

Other aspect, objects, and the several advantages of the present invention will be apparent to one skilled in the art from a reading of the following disclosure and appended claims.

To achieve this and other advantages and in accordance with the purpose of the present invention, the method includes the steps of depositing a first insulating layer composed of an oxide layer over a semiconductor substrate having a field effect transistor. The first insulating layer is etched to form a contact hole therein to one of two source/drain areas of the field effect transistor. A first conductive layer composed of polysilicon is deposited in the contact hole and over the semiconductor substrate. The first conductive layer is then planarized. The planarization process may be carried out by two ways. One way is to planairze the first conductive layer down to the first insulating layer and thereby forming a contact plug. The other way is to planarize a top surface portion of the first conductive layer with remaining a predetermined thickness of the first conductive layer about 200 Å to 500 Å. In case that the contact plug is formed, a second conductive layer composed of polysilicon is deposited on the contact plug and over the first conductive layer and then a top surface portion of the second conductive layer is planarized with remaining predetermined thickness of about 200 Å to 500 Å. The next following process sequences are the same. A second insulating layer then deposited over the second conductive layer. The second insulating layer has a thickness to that defines the height of the storage node preferably 10400 Å to 11000 Å. The second insulating layer is etched using a capacitor mask and thereby to form an opening therein to the second conductive layer at a position opposite to underlying the contact plug. A third conductive layer composed of polysilicon is deposited in the opening to form a third conductive pattern, i.e., the storage node pattern. The second insulating layer is removed by wet etching using the second conductive layer as an etching stopper layer. Finally, the second conductive layer outside the storage node pattern is etched back thereby to form the storage node.

With this invention, the about 200 Å to 500 Å thick second conductive layer is provided to serve as an etching stopper layer during the step of etching the second insulating layer and thus it can minimize the over-etching phenomenon of the polysilicon at the bottom edge of the storage node.

BRIEF DESCRIPTION OF THE DRAWINGS

The invention maybe understood and its objects will become apparent to those skilled in the art by reference to the accompanying drawings as follows.

DETAILED DESCRIPTION OF THE PREFERRED EMBODIMENTS

The preferred embodiment of the present invention will now be described with reference to the accompanying drawings. The present invention relates to a method for fabricating a DRAM cell capacitor which can be fabricated on the field effect transistors structures that are currently used in the manufacture of DRAMs. Therefore, the process for forming the field oxide layer and the field effect transistor structure as presently practiced in manufacturing DRAM cells are only briefly described in order to better understand the current invention.

Figure 1:
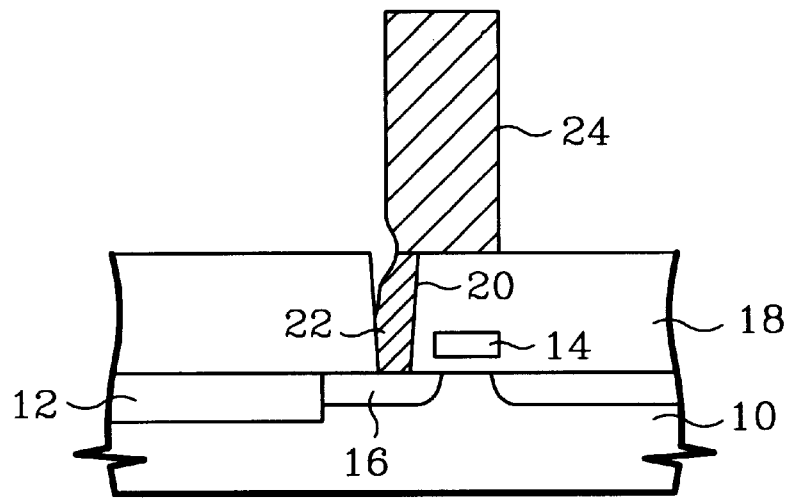
FIG. 1 cross-sectional view of a DRAM cell capacitor according to the prior art method.
Figure 2A:
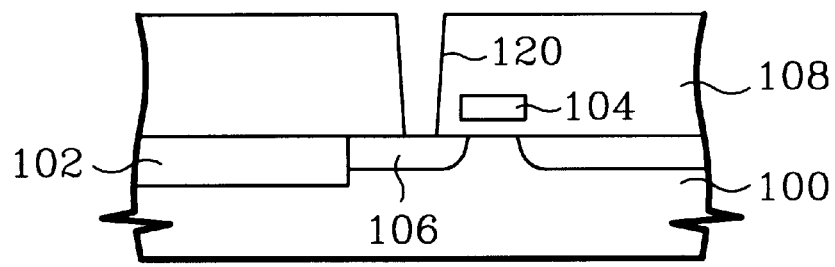
FIG. 2A to FIG. 2D are flow diagrams showing the process steps of a novel method for fabricating a DRAM cell capacitor according to the present invention.

Referring to FIG. 2A, a spaced field oxide area 102 is provided on a semiconductor substrate 100. The semiconductor substrate 100 has an active region surrounded by the spaced field oxide area 102. Briefly, the method commonly practiced in the industry is to use a thin thermal oxide and a silicon nitride layer as an oxidation mask layer. The desired field oxide areas is etched open in the oxide/nitride layer using conventional photolithographic techniques and a field oxide layer thermally grown. The semiconductor devices are then fabricated on the silicon surface in non-oxidized areas, after removing the silicon nitride layer using a wet etch. For the DRAM cell the typical transistor used is a filed effect transistor having a gate electrode and is now briefly described. A gate electrode layer such as polysilicon is deposited and gate mask insulating layer is deposited thereon. The gate mask layer and the gate electrode layer are etched to form a gate structure. The next steps is to form the lightly doped source/drain. This doping is usually accomplished by implanting impurities. After forming the lightly doped source/drain, sidewall spacers are formed on the gate electrode structure. These spacers are formed by depositing an insulating layer such as silicon nitride layer on the semiconductor substrate and using an anisotropic etch to etch back to the source/drain surface. Typically the source/drain contact areas 106 are formed next by implantation to complete the field effect transistor 104.

Referring still to FIG. 2A, a first insulating layer 108 composed of oxide layer is deposited over the semiconductor substrate 100. The first insulating layer 108 is then etched to form a contact hole 120 therein to the source/drain area 106. The contact hole 106 has a width in the range of between about 100 nm to 130 nm. Conventional photolithographic techniques and anisotropic etching are used to form the opening, and as shown in FIG. 2A, the contact hole exposes the source/drain area 106.

Figure 2B:
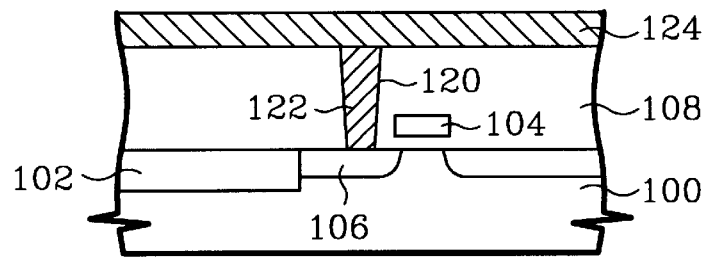

The next process sequence is critical to this invention. Referring to FIG. 2B, the contact hole 120 is filled up with a first conductive layer such as polysilicon thereby to form a contact plug 122 and an etching stopper polysilicon layer 124 is formed on the contact plug 122 and over the first insulating layer 108. There are two ways to form the etching stopper polysilicon layer 124 in accordance with this invention. The etching stopper polysilicon layer 124 is formed to have a thickness of about 200 Å to 500 Å considering the over etching phenomenon of the polysilicon at the storage node bottom, i.e., at the interface between the storage node and the contact pad.

One way is firstly to deposit a first conductive layer 124 composed of polysilicon in the contact hole 120 and over the first insulating layer 108. The top surface of the deposited first conductive layer is planarized with remaining about 200 Å to 500 Å thick polysilicon 124 over the first insulating layer and thereby forming etching stopper polysilicon layer 124. The planarization process may be carried out by CMP or etch back.

The other way is firstly to deposit a first conductive layer 122 composed of polysilicon in the contact hole 120 and over the first insulating layer 108. After that, the planarization 10 process such as CMP or etch back is carried out down to the first insulating layer 108 and thereby forming a contact plug 122. A second conductive layer 124 such as polysilicon is deposited on the contact plug 122 and over the first insulating layer 108 and then planarized the top surface and thereby forming the etching stopper polysilicon layer 124 having a thickness of about 200 Å to 500 Å.

Figure 2C:
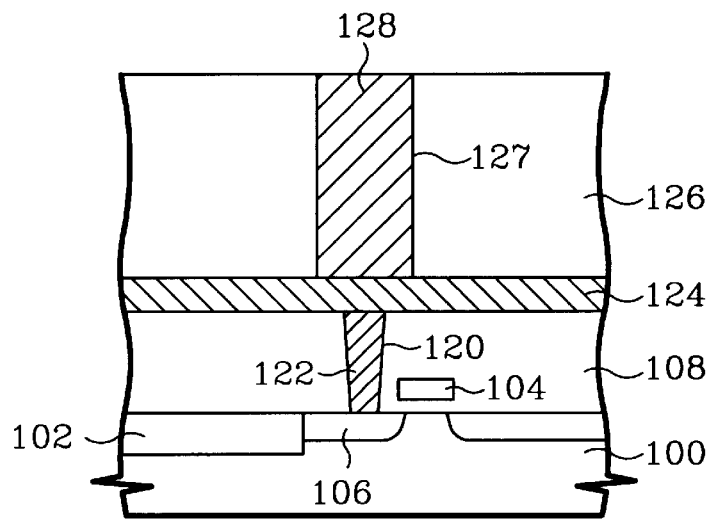

Now referring to FIG. 2C, after forming the etching stopper polysilicon layer 124, a second insulating layer 126 such as silicon oxide layer or silicon nitride layer is formed to a thickness of about 10400 Å to 11000 Å. The second insulating layer 126 has a thickness to that defines the height of a storage node. The second insulating layer is then etched using storage node mask and to form an opening 127 therein at a position opposite to the underlying contact pad 122. The opening is filled up with a third conductive layer such as polysilicon as for the storage node. Planarization process such as CMP or etch back is carried out on the third conductive layer until the top surface of the second insulating layer 126 is exposed and thereby to form a storage node pattern 128.

Figure 2D:
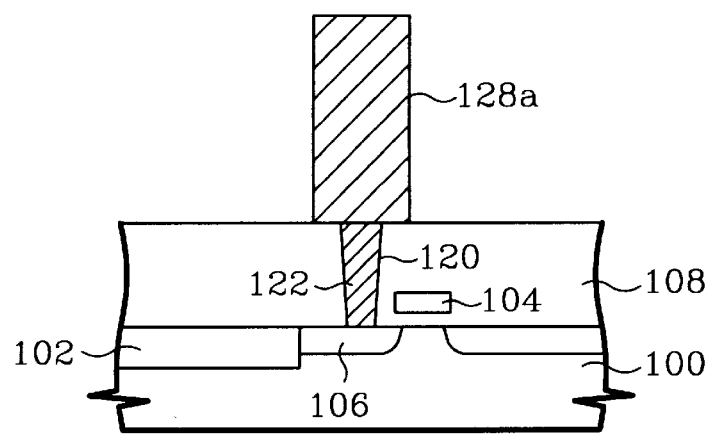

Referring to FIG. 2D, the second insulating layer 126 outside the storage node pattern 128 is removed by wet etching. Herein we must pay attention to the fact that during this wet etching, the etching stopper polysilicon layer 124 serves as an etching stopper layer. In other words, the etching stopper polysilicon layer 124 is provided to prevent the over etch of the polysilicon at the interface between the storage node and the contact plug and thereby to prevent the storage node falling down to cause short in the subsequent cleaning process. After that, the etching stopper polysilicon layer 124 outside the storage node pattern 128 is etched back thereby to form a storage node 128. During this etch back process, a top portion of the storage node pattern may be etched about 400 Å to 1000 Å.

While this invention has been particularly shown and described with reference to the preferred embodiments thereof, it will be understood by those skilled in the art that various changes in form and details may be made without departing from the spirit and scope of this invention.

What is claimed is:

1. A method for forming a storage node, said method comprising the steps of:

depositing a first insulating layer on a semiconductor substrate;

etching said first insulating layer to form a contact hole therein;

depositing a first conductive layer over said first insulating layer having said contact hole;

depositing a second insulating layer on said first conductive layer;

etching said second insulating layer to form an opening in said second insulating layer to expose a portion of said first conductive layer;

filling said opening with a second conductive layer thereby to form a storage node pattern;

removing said second insulating layer outside of said storage node pattern; and etching said first conductive layer until said first insulating layer outside of said storage node pattern is exposed thereby to form a storage node.

2. The method according to claim 1, wherein said first insulating layer comprises an oxide layer.

3. The method according to claim 1, wherein said contact plug has a top surface with a diameter in the range of from 100 nm to 130 nm.

4. The method according to claim 1, wherein said second conductive layer has a thickness of about 200 Å to 500 Å and said second insulating layer has a thickness of about 10400 Å to 11000 Å.

5. The method according to claim 1, wherein said step of removing said second insulating layer is carried out by wet etching.

6. The method according to claim 1, wherein said step of etching said second conductive layer is carried out by etch back.

7. The method according to claim 1, wherein said second conductive layer serves as an etching stopper layer during said step of removing said second insulating layer.

8. The method according to claim 1, wherein said storage node has a thickness of about 10000 Å.

9. The method according to claim 1, wherein said step of depositing said first conductive layer comprising the steps of:

filling said contact hole with said first conductive layer thereby to form a contact plug; and depositing a thin first conductive layer on said contact plug.

10. A method for fabricating a DRAM cell capacitor on a semiconductor substrate having a device area formed therein, a field oxide layer and a field effect transistor formed on said device area, said field effect transistor having a gate electrode with an insulating cap layer and an insulating sidewall spacer thereon and having source/drain areas in and on said device area and adjacent to said gate electrode, said method comprising the steps of:

depositing a first insulating layer on said field effect transistor and said semiconductor substrate;

etching said first insulating layer to form a contact hole therein to at least one of two said source/drain areas;

depositing a first conductive layer in said contact hole and over said first insulating layer;

depositing a second insulating layer over said first conductive layer;

etching said second insulating layer to form an opening in said second insulating layer to expose a portion of said first conductive layer;

filling said opening with a second conductive layer thereby to form a storage node pattern;

removing said second insulating layer outside of said storage node pattern;

etching said first conductive layer until said first insulating layer outside of said storage node pattern is exposed thereby to form a storage node.

11. The method according to claim 9, wherein said first conductive layer serves as an etching stopper layer during said step of etching said second insulating layer.

* * * * *